United States Patent [19]

Kato

[11] Patent Number: 4,691,242
[45] Date of Patent: Sep. 1, 1987

[54] CONTACT TYPE IMAGE SENSOR HAVING MULTIPLE COMMON ELECTRODES TO PROVIDE INCREASED PIXEL DENSITY

[75] Inventor: Toshiaki Kato, Kanagawa, Japan

[73] Assignee: Fuji Electric Co., Ltd., Kawasaki, Japan

[21] Appl. No.: 864,035

[22] Filed: May 16, 1986

[30] Foreign Application Priority Data

May 16, 1985 [JP] Japan ................. 60-104374

[51] Int. Cl.⁴ .............. H01L 27/14; H01L 31/08
[52] U.S. Cl. ............................. 358/294; 250/578
[58] Field of Search ........... 358/213, 294, 293, 212; 250/578

[56] References Cited

U.S. PATENT DOCUMENTS 4,025,954  5/1977  Bert ........................... 358/213
4,431,913  2/1984  Sekimoto et al. ........... 250/578
4,567,374  1/1986  Takenouchi et al. ........ 358/212
4,570,076  2/1986  Hamano et al. ............. 358/212

Primary Examiner—Gene Z. Rubinson
Assistant Examiner—Stephen Brinich
Attorney, Agent, or Firm—Brumbaugh, Graves, Donohue & Raymond

[57] ABSTRACT

A contact-type image sensor comprises a layer of photoelectric material on one of whose surfaces are formed a linear array of discrete electrodes and on the other of whose surfaces are formed at least two common electrodes each of which has portions which are opposite a different limited portion of each of the discrete electrodes whereby the number of picture elements may be at least doubled when the two common electrodes are operated in turn as the discrete electrodes are successively switched on for readout.

5 Claims, 4 Drawing Figures

CONTACT TYPE IMAGE SENSOR HAVING MULTIPLE COMMON ELECTRODES TO PROVIDE INCREASED PIXEL DENSITY

BACKGROUND OF THE INVENTION

The present invention relates to a contact type image sensor useful particularly for facsimile transmisson. A known form of image sensor of this type has a structure that includes a plurality of a discrete electrodes, each corresponding to a picture element to be read, which are formed on an insulated substrate. A photoelectric layer is formed over such electrodes andc thereafter a common electrode which is common to all picture elements (corresponding to all discrete electrodes) is formed over the layer. FIG. 2 shows an example of such image sensor, wherein a plurality of discrete electrodes 5 arranged in a row and a common electrode 4 overlying all of such discrete electodes are provided on opposite sides of a photoeloectric conversion layer 3, for example, of amorphous silicon (hereinafter abbreviated as a-Si) and the assembly is supported on an insulsted substrate 1.

On the occasion of reading a picture, the common electrode 4 is maintained at a fixed first potential and a signal is processed by switching sequentially the discrete electrodes 2 in turn to a second potential through the lead 5. Therefore, a single line is divided into the same number of picture elements as the discrete electrodes, and the picture elements are represented by an electrical signal extracted from the overlapped area where such discrete electrode 2 overlies the common electrode 4.

With a sensor of this kind, the number of discrete electrodes per unit length fixes at the same value the number of picture elements per unit length which can be reproduced. In some instances, it is desirable to achieve a greater number of picture elements than the number of discrete electrodes.

It is therefore an object of the present invention to provide a contact-type image sensor which permits realizing a picture eement density of two or more values almost at the same cost as the conventional type, where the picture element density is limited to a single value.

SUMMARY OF THE INVENTION

An image sensor in accordance with the present invention comprises a photoelectric layer having a pair of opposed major surfaces on one of which is a first set of discrete electrodes spaced apart in a row and on the other of which is a second set of at least two common electrodes, each of said common electrodes having a limited portion opposite a different portion of each of the discrete electrodes, one of the two sets of electrodes being transparent to pass incident light into the photoelectric layer. A first picture element density is achieved if all the common electrodes sare tied together electrically, i.e. maintained at the same steady potential, in which case the picture element density corresponds to the density of the discrete electrodes. A higher density of picture elements can be realized if the commn electrodes are individually switched to the reading potential in turn in which case the effective densityy is multiplied by the number of common electrodes.

DETAILED DESCRIPTION OF THE INVENTION

Figure 1:
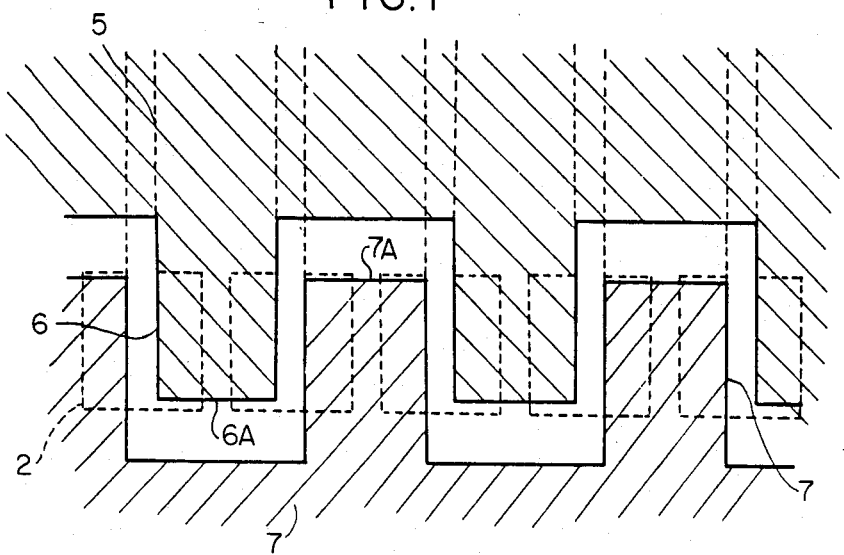
FIG. 1 is a plan view of an embodiment of the present invention.
Figure 2A:
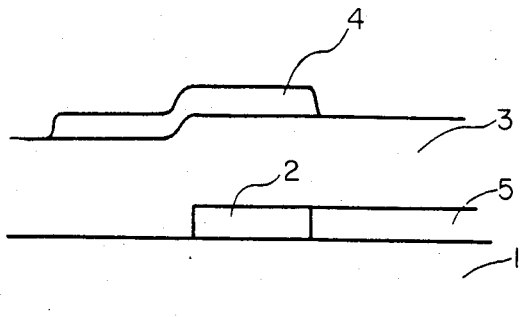
FIG. 2 shows a prior art image sensor where (a) is a sectional view, (b) is a plan view.
Figure 2B:
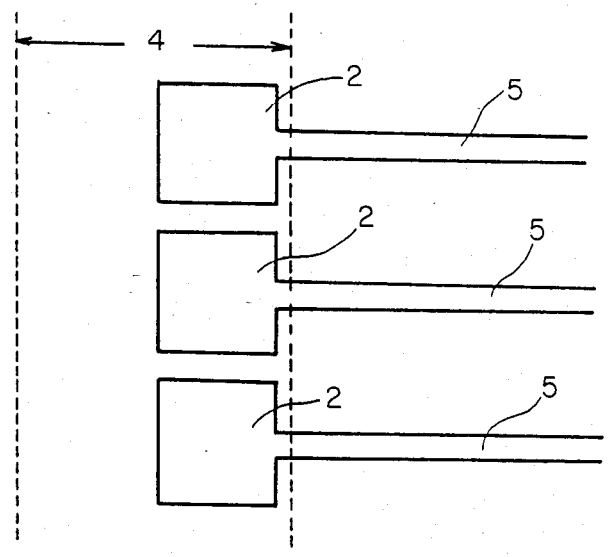

FIG. 1 shows an embodiment of the present invention and the like parts as those in FIG. 2 are given like reference numerals. Chromium is sputtered to a thicknes of 1000 A at 200° C. on a transparent glass substrate (not shown) and the plurality of discrete electrodes 2 are formed as indicated by the dotted line, as in the case of FIG. 2, by a photoetching process. Each discrete electrode 2 has a rectangular form with dimensions of 115 $\mu$m in the row direction and 80 $\mu$m in the perpendicular direction and the wiring lead 5 has a width of 25 $\mu$m. Although not shown, a photoelectric conversion film 3 similar to that of FIG. 2 is formed thereon. The photoelectric conversion film 3 is in undoped a-Si layer formed by decomposition of silane in a high frequency glow discharge in known fashion. As indicated by the hatched area, a set of two common electrodes 6, 7 of which finger portions are interdigitally arranged on such a-Si layer. The finger portions 6A, 7A of each common electrode have a width of 100 $\mu$m, allowing a gap of 25 $\mu$m between them. Each common electrode is formed in known fashion as follows: the a-Si layer 3 is coated with a photo resist in the thickness of 1.5 $\mu$m; the photoresist is developed in such a manner that a window is formed in the area where the common electrode is to be formed and the other areas are left covered; an indium-doped tin oxide (ITO) fim is vacuum deposited to a thickness of 2000 A at 150° C.; the resist is peeled off by a resist removal liquid; and the ITO film formed thereon is removed by the lift-off method. The alignment is carried out so that the area of overlapped portion between the discrete electrode 2 and the common electrodes 6 or 7 has the dimensions of about 45 $\mu$m × 80 $\mu$m.

For reading with a picture element density of 8 dots/mm, the common electrodes 6, 7 are electrically connected in parallel to be maintained at the same steady potential and the discrete electrodes 2 are sequentially switched to the reading potential in order to provide an output signal.

For reading with a picture element density of 16 dots/mm, such procedures are repeated except that the common electrodes are maintained electrically separate and each is alternately maintained at its potential for reading while the discrete electrodes are switched to a reading potential in turn so that each of the two separate portions of overlap of the discrete electrodes effectively serves independently to produce a picture element. The output signals obtained here faithfully correspond to the white and black of the original picture and the outputs obtained here for both 8 dots/mm and 16 dots/mm are little different from the outputs obtained with conventional image sensors designed for 8 dots/mm or 16 dots/mm densities.

Figure 3:
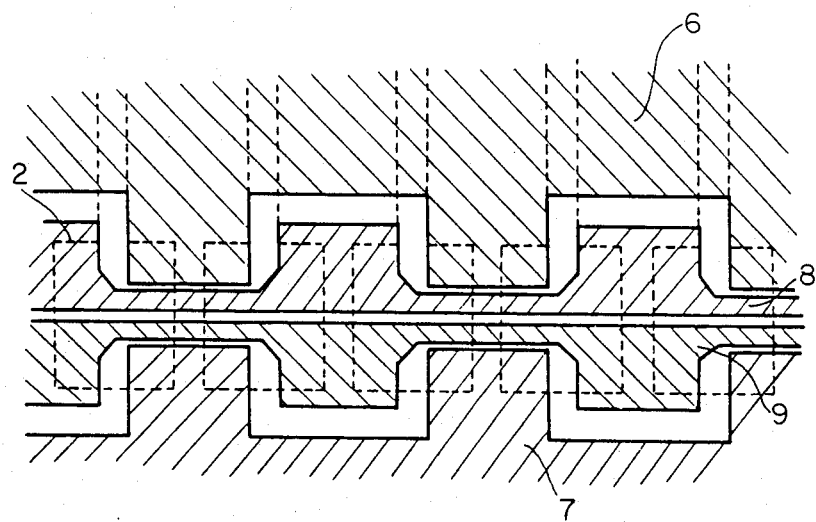
FIG. 3 is a plan view of another embodiment of the present invention.

FIG. 3 shows another embodiment of the invention which effectively provides two lines of picture elements. It differs from the embodiment shown in FIG. 1 in that the set of common electrodes includes four electrodes 6, 7, 8 and 9 each of which has portions which overlap a different limited portion of each of the discrete electrodes. For reading with such a sensor, the first of the two lines is read by alternately establishing the potential for reading only on the common electrodes 6 and 8 while sequentially switching the discrete electrodes to their reading potential. Thereafter the second line is read by establishing a potential for reading only on common electrodes 7 and 9 while sequentially switching the discrete electrodes to their reading potential.

By this technique each discrete electrode serves to read at separate times four picture elements, two in the vertical dimension and two in the horizontal dimension, corresponding to the four portions of each which overlap the four common electrodes as seen in FIG. 3.

This embodiment has the advantage that if a defect causes a limited shortcircuiting of a picture element, such defect would appear only on one of the two lines read.

Moreover, when the common electrodes 6 to 9 are simultaneously connected in parallel for the reading, a single line can be read with the picture element density of ½ per line.

From the foregoing, it is evident that the invention provides an image sensor whose reading rate can be readily varied by an integral multiple when desired by applying appropriate potentials to the common electrodes and the discrete electrodes.

Moreover, it can be appreciated that an image sensor in accordance with the invention can be readily manufactured by essentially the same processing as prior art image sensors, the processing differing only in the patterning of the common electrodes so that the improved image sensor can be realized with little additional manufacturing cost.

What is claimed:

1. An image sensor comprising a layer of a photoelectric material having a pair of opposed major surfaces, a first set comprising a plurality of discrete electrodes spaced apart in a row on one of the pair of major surfaces of said layer, and a second set comprising at least two separate common electrodes on the other of said pair of major surfaces of the layer, each of said common electrodes having portions opposite a different limited portion of each of the discrete electrodes, one of the two sets of electrodes being transparent to pass incident radiation to the layer.

2. An image sensor in accordance with claim 1 in which there are two common electrodes, each of which has portions opposite almost half of each discrete electrode.

3. An image sensor in accordance with claim 1 in which there are four common electrodes and each has portions opposite almost a quarter of each discrete electrode.

4. An image sensor in accordance with claim 1 further comprising means for switching the discrete electrodes sequentially to a reading potential and means for switching the common electrodes in turn to a potential for reading.

5. An image sensor in accordance with claim 1 further comprising means to selectively electrically connect the common electrodes.

* * * * *